United States Patent

Yeh et al.

[11] Patent Number: 5,861,329
[45] Date of Patent: Jan. 19, 1999

[54] METHOD OF FABRICATING METAL-OXIDE SEMICONDUCTOR (MOS) TRANSISTORS WITH REDUCED LEVEL OF DEGRADATION CAUSED BY HOT CARRIERS

[75] Inventors: Wen-Kuan Yeh, Chupei; Coming Chen, Tao Yuan Hsien; Meng-Jin Tsai, Hsinchu Hsien; Jih-Wen Chou, Hsinchu, all of Taiwan

[73] Assignee: United Microelectrics Corp., Taiwan

[21] Appl. No.: 764,254

[22] Filed: Dec. 12, 1996

[30] Foreign Application Priority Data

Oct. 19, 1996 [TW] Taiwan .................................. 85112827

[51] Int. Cl.$^6$ .......................... H01L 21/265; H01L 21/31
[52] U.S. Cl. ............................................ 438/232; 438/532
[58] Field of Search .................................. 438/769, 232, 438/532, 775, 595, 776, 777, DIG. 112, 768, 230, 231

[56] References Cited

U.S. PATENT DOCUMENTS

| | | | |
|---|---|---|---|
| 4,277,320 | 7/1981 | Beguwala et al. | 438/776 |
| 4,298,629 | 11/1981 | Nozaki et al. | 438/777 |
| 4,331,710 | 5/1982 | Nozaki et al. | 148/DIG. 112 |
| 4,960,723 | 10/1990 | Davis et al. | 438/595 |
| 5,332,697 | 7/1994 | Smith et al. | 438/775 |
| 5,532,176 | 7/1996 | Katada et al. | 438/232 |
| 5,567,638 | 10/1996 | Lin et al. | 438/532 |
| 5,674,788 | 10/1997 | Wristers et al. | 438/769 |

*Primary Examiner*—Charles Bowers
*Assistant Examiner*—David S. Blum
*Attorney, Agent, or Firm*—Rabin & Champagne, P.C.

[57] ABSTRACT

A method of fabricating a metal-oxide semiconductor (MOS) transistor is provided. This method is devised particularly to reduce the level of degradation to the MOS transistor caused by hot carriers. In the fabrication process, a plasma treatment is applied to the wafer to as to cause the forming of a thin layer of silicon nitride on the wafer which covers the gate and the lightly-doped diffusion (LDD) regions on the source/drain regions of the MOS transistor. This thin layer of silicon nitride acts as a barrier which prevents hot carriers from crossing the gate dielectric layer, such that the degradation of the MOS transistor due to hot carriers crossing the gate dielectric layer can be greatly minimized.

8 Claims, 2 Drawing Sheets

METHOD OF FABRICATING METAL-OXIDE SEMICONDUCTOR (MOS) TRANSISTORS WITH REDUCED LEVEL OF DEGRADATION CAUSED BY HOT CARRIERS

BACKGROUND OF THE INVENTION

1. Field of the Invention

This invention relates to semiconductor integrated circuit (IC) devices, and more particularly, to a method of fabricating a metal-oxide semiconductor (MOS) transistor with reduced level of degradation caused by hot carriers.

2. Description of Related Art

In designing MOS transistors, if the channel between the source/drain regions is reduced in size, the depletion regions in the source/drain regions will be overlapped with the channel, which effectively further reduces the size of the channel. In an enhancement mode MOS transistor, for example, if the bias applied thereto is fixed, the foregoing effect will cause the transversal electric field across the channel to be increased. As a consequence of this, the electrons in the channel will gain energy from the increased electric field. Therefore, the electrons near the junction between the channel and the drain region will be higher in energy than the electrons elsewhere that are in thermal equilibrium. These electrons are thus customarily referred to as "hot electrons". In proton-type MOS transistors, the energized protons are called "hot protons". Generically, these two kinds of carriers are both referred to as "hot carriers".

Since the hot carriers near the drain region gain an energy higher than the energy gap in the MOS transistor, the covalent electrons near the drain regions will be hit by these hot carriers and thereby raise in energy level to the conduction band. As a result, more electron-hole pairs will be produced. In conclusion, if the channel in the MOS transistor is shortened, the number of carriers in the channel near the drain region will be increased. This phenomenon is customarily referred to as "carrier multiplication".

These electrons that are additionally produced due to carrier multiplication will be attracted to the drain region, thus increasing the current in the drain region. In addition, part of these electrons can penetrate into the gate dielectric layer, thus causing the generation of more holes.

One part of these holes will flow to the substrate, thus causing a current flow in the substrate; and the other part of the same will be captured by the source region, thus causing an enhancement to the NPN junction that will cause the generation of more hot electrons. This increased level of carrier multiplication will cause the adverse effect of electrical breakdown in the MOS transistor, which means a degradation to the performance and characteristics of the MOS transistor.

One solution to reduce the level of carrier multiplication is to form a lightly doped diffusion (LDD) region in the source/drain regions near the channel, which is doped with a less concentration of impurities than the source/drain regions so as to reduce the intensity of the electric field across the channel. A conventional method for forming an LDD region in a MOS transistor is described in the following with reference to FIGS. 1A through 1C.

Referring first to FIG. 1A, in the foremost step, a semiconductor substrate, such as a silicon substrate 10, is prepared. The silicon substrate 10 is then subjected to local oxidation of silicon (LOCOS) so as to form at least a pair of field oxide layers 12 thereon, which defines an active region on the silicon substrate 10. Thereafter, a gate dielectric layer 14 and a polysilicon gate layer 16 are successively formed over the active region, which two layers in combination form a gate (14, 16) for the MOS transistor.

Referring further to FIG. 1B, in the subsequent step, a pair of LDD regions 18 is formed on the silicon substrate 10 by diffusing an impurity semiconductor with a low concentration into the regions on either side of the gate (14, 16).

Referring finally to FIG. 1C, in the subsequent step, a layer of a dielectric material, such as silicon dioxide, is formed on the sidewall of the gate (14, 16), which serves as a spacer 19 for the gate (14, 16). Thereafter, a pair of source/drain regions 20 are formed on the silicon substrate 10 by doping the same type of impurity semiconductor with a high concentration (i.e., the same impurity semiconductor that is used earlier to form the LDD regions 18 but here is applied with a higher concentration) into the LDD regions 18. At the same time during this process, the polysilicon gate layer 16 is also doped, such that the conductivity thereof is increased.

One major drawback to the foregoing method, however, is that the gate dielectric layer 14 could be easily get damaged during the process of doping the impurity semiconductor into the wafer to form the heavily doped regions that serve as the source/drain regions. Moreover, although the provision of the LDD regions in the source/drain regions can reduce the hot carrier effect, there are still a small number of hot carriers that will be accelerated by the electric field across the channel, which causes a high current in the channel that will then cause an electrical breakdown in the MOS transistor. Some of these hot carriers will even cross the gate dielectric layer 14 to the polysilicon gate layer 16 and thereby be trapped in the gate dielectric layer 14. The trapped carriers will cause a change in the amount of electric charges in the gate dielectric layer 14, thus altering the threshold voltage ($V_t$) of the MOS transistor. The characteristics and performance of the MOS transistor thus could be degraded.

SUMMARY OF THE INVENTION

It is therefore a primary objective of the present invention to provide a MOS transistor fabrication method which can reduce the level of degradation to the MOS transistor caused by hot carriers.

In accordance with the foregoing and other objectives of the present invention, a new and improved method for fabricating MOS transistors is provided. The method of the invention can be performed in two ways.

The first way to perform the method includes: a first step of preparing a semiconductor wafer of a first type; a second step of forming a gate and a field oxide layer on the wafer, the gate including a polysilicon electrode and a dielectric layer; a third step of conducting a plasma treatment on the wafer with a plasma of nitrogen; a fourth step of conducting a first ion implantation process on the gate and selected areas on both sides of the gate with an impurity semiconductor of a second type so as to form a pair of LDD regions on both sides of the gate and a thin layer of silicon nitride which covers the LDD regions and the gate; a fifth step of forming a silicon dioxide spacer on the sidewall of the gate; and a final sixth step of using the silicon dioxide spacer as a mask to conduct a second ion implantation process on the wafer with an impurity semiconductor of the second type so as to form a pair of heavily doped source/drain regions in the wafer.

The second way to perform the method is substantially the same as the foregoing process except that the fourth step in the foregoing process is performed prior to the third step; that is, the plasma treatment is performed after the step of forming the LDD regions.

By either way, a thin layer of silicon nitride covering the LDD regions and the gate can be formed in the wafer. This thin layer of silicon nitride acts a barrier which prevents hot carriers from crossing the gate dielectric layer, such that degradation of the MOS transistor due to hot carriers crossing the gate dielectric layer can be minimized.

BRIEF DESCRIPTION OF DRAWINGS

The invention can be more fully understood by reading the following detailed description of the preferred embodiments, with reference made to the accompanying drawings, wherein.

DETAILED DESCRIPTION OF PREFERRED EMBODIMENT

Figure 1A:
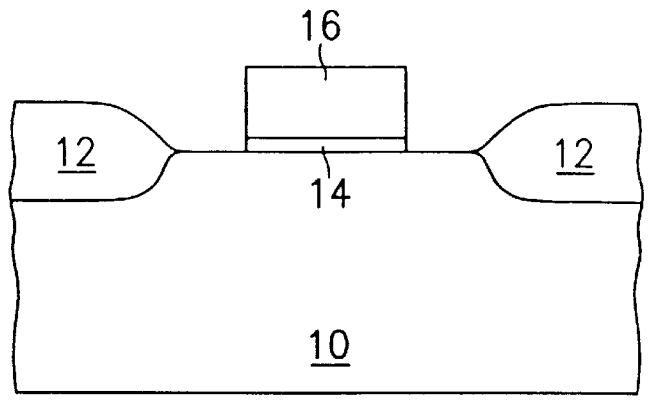
FIGS. 1A through 1C are schematic sectional diagrams used to depict the steps involved in a conventional MOS transistor fabrication method.

The new method of the invention for fabricating a MOS transistor will be described in the following with reference to FIGS. 2A through 2C. Elements in these figures that are identical in structure and purpose to those illustrated in FIGS. 1A through 1C will be labeled here with the same reference numerals.

Figure 1B:
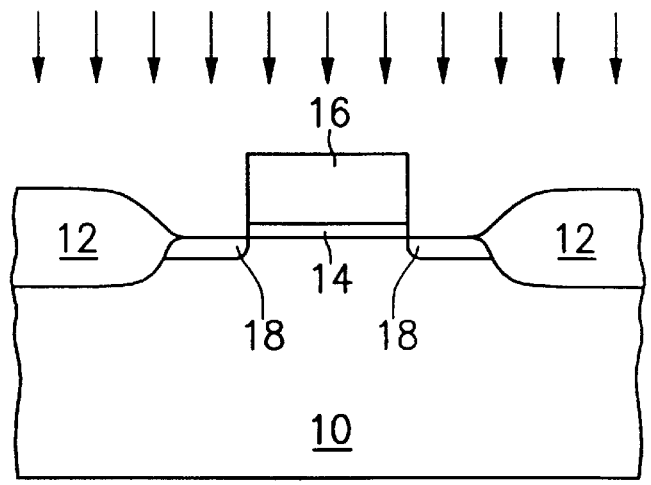
Figure 1C:
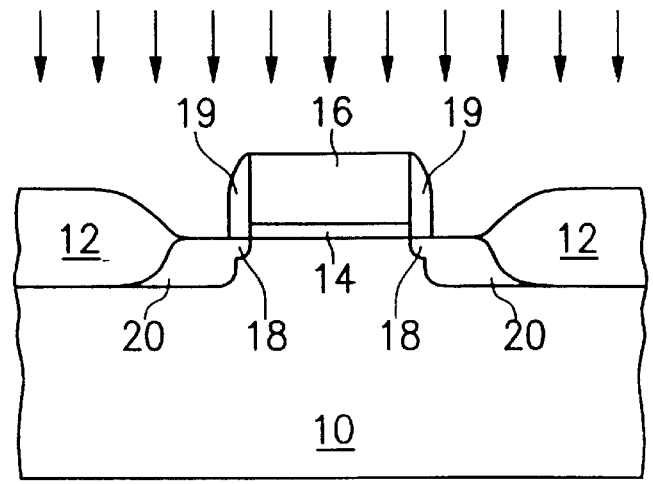
Figure 2A:
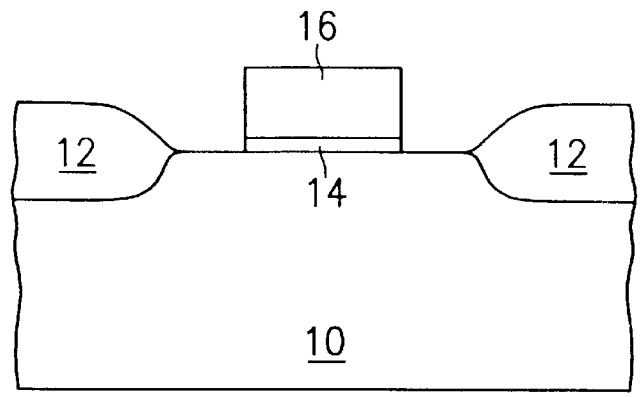
FIGS. 2A through 2C are schematic sectional diagrams used to depict the steps involved in a process according to the present invention for fabricating a MOS transistor.

Referring first to FIG. 2A, the foremost step is the same as depicted with reference to FIG. 1A, in which a semiconductor substrate, such as a silicon substrate 10, is prepared. The silicon substrate 10 is then subjected to local oxidation of silicon (LOCOS) so as to form at least a pair of field oxide layers 12 thereon, which defines an active region on the silicon substrate 10. Thereafter, a gate dielectric layer 14 and a polysilicon gate layer 16 are successively formed over the active region, which two layers in combination form a gate (14, 16) for the MOS transistor.

To suppress the effect caused by hot carriers crossing the gate dielectric layer, the method of the invention includes a featured process to form a thin dielectric layer over the gate dielectric layer and the source/drain regions, which helps to enhance the strength of the sidewall spacer on the gate. There are two ways to form such a thin dielectric layer, which will be respectively described in the following with reference to FIG. 2B.

Figure 2B:
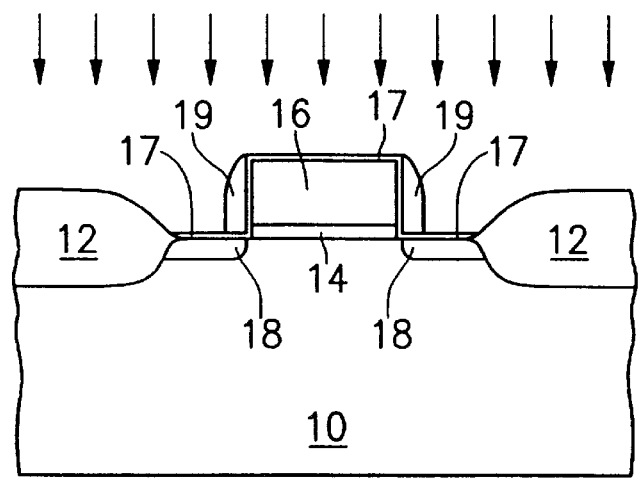

Referring to FIG. 2B, one way to perform the foregoing process is first to treat the wafer with a plasma of nitrogen so as to allow the polysilicon gate layer 16 and the surface of the silicon substrate 10 to contain nitrogen molecules. The gas for forming the plasma can be selected from the group consisting of nitrogen, nitrogen oxide, a mixture of nitrogen/oxygen, and ammonia. The plasma is applied to the wafer with an energy of 150 W and a flow rate of 100 sccm. Following this, an impurity semiconductor of a different type from that of the silicon substrate 10 is doped into the regions on both sides of the gate (14, 16) on the silicon substrate 10 so as to form a pair of LDD regions 18. Thereafter, a silicon dioxide layer is formed over the wafer and then etched back to remove part of the silicon dioxide layer. The remaining part of the silicon dioxide layer serves as a spacer 19 on the sidewall of the gate (14, 16). The nitrogen molecules in the polysilicon gate layer 16 and the surface of the silicon substrate 10 can react with the silicon in the same to form a thin layer of silicon nitride 17 which is the desired thin dielectric layer that covers the surfaces of the LDD regions 18 and the gate (14, 16).

Another way to perform the foregoing process is to firstly form the LDD regions 18 and then conduct the plasma treatment in the subsequent step. The LDD regions 18 are formed also by doping an impurity semiconductor of a different type from that of the silicon substrate 10 into those regions on both sides of the gate (14, 16) on the silicon substrate 10. Thereafter, the wafer is treated with a plasma of nitrogen, allowing the polysilicon gate layer 16 and the surface of the silicon substrate 10 to contain nitrogen molecules. The gas for forming the plasma is selected from the group consisting of nitrogen, nitrogen oxide, a mixture of nitrogen/oxygen, and ammonia. The plasma is applied to the wafer with an energy of 150 W and a flow rate of 100 sccm. Subsequently, a silicon dioxide layer is formed over the wafer and then etched back to remove part of the silicon dioxide layer. The remaining part of the silicon dioxide layer then serves as a spacer 19 on the sidewall of the gate (14, 16). The nitrogen molecules in the polysilicon gate layer 16 and the surface of the silicon substrate 10 can react with the silicon in the same to form a thin layer of silicon nitride 17 which is the desired thin dielectric layer that covers the surfaces of the LDD regions 18 and the gate (14, 16).

Figure 2C:
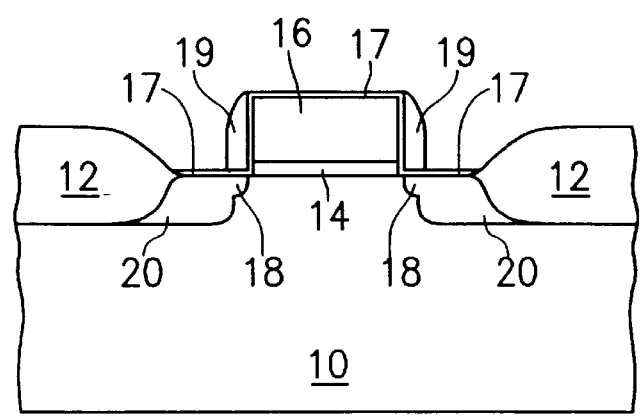

Referring finally to FIG. 2C, in the subsequent step, the silicon dioxide spacer 19 on the sidewall of the gate (14, 16) is used as a mask to conduct an ion implantation process on the wafer so as to dope an impurity semiconductor with a high concentration into the LDD regions 18. At the same time during this process, the wafer is being heated so as to drive in the impurities in the LDD regions 18 to form a pair of source/drain regions 20 in the wafer. By this process, the impurity semiconductor is also doped into the polysilicon gate layer 16 so as to increase the conductivity thereof. To complete the fabrication of the MOS transistor, all the following steps involve conventional techniques so that description thereof will not be detailed.

By either way, a thin layer of silicon nitride covering the LDD regions and the gate can be formed in the wafer. This thin layer of silicon nitride acts as a barrier which prevents hot carriers from crossing the gate dielectric layer. As a result, the level of degradation to the MOS transistor due to hot carriers crossing the gate dielectric layer can be minimized.

The invention has been described using exemplary preferred embodiments. However, it is to be understood that the scope of the invention is not limited to the disclosed embodiments. To the contrary, it is intended to cover various modifications and similar arrangements. The scope of the claims, therefore, should be accorded the broadest interpretation so as to encompass all such modifications and similar arrangements.

What is claimed is:

1. A method for fabricating a MOS transistor, comprising the steps of:

(1) preparing a semiconductor wafer of a first type;

(2) forming a gate and a field oxide layer on the wafer, the gate including a polysilicon electrode and a dielectric layer;

(3) conducting a plasma treatment on the wafer with a plasma of nitrogen;

(4) conducting a first ion implantation process on the gate and selected areas on both sides of the gate with an impurity semiconductor of a second type so as to form a pair of LDD regions on both sides of the gate and a thin layer of silicon nitride which covers the LDD regions and the gate;

(5) forming a spacer of silicon dioxide on the sidewall of the gate, the silicon nitride remaining over the LLD regions and the gate, and forming; and (6) using the spacer as a mask to conduct a second ion implantation process on the wafer with an impurity semiconductor of the second type so as to form a pair of heavily doped source/drain regions in the wafer.

2. The method of claim 1, wherein the plasma is formed by using a gas selected from the group consisting of $N_2$, nitrogen oxide, a mixture of nitrogen/oxygen, and ammonia.

3. The method of claim 2, wherein the plasma is applied to the wafer with an energy of 150 W and a flow rate of 100 sccm.

4. A method for fabricating a MOS transistor, comprising the steps of:

(1) preparing a semiconductor wafer of a first type;

(2) forming a gate and a field oxide layer on the wafer, the gate including a polysilicon electrode and a dielectric layer;

(3) conducting a first ion implantation process on the gate and selected areas on both sides of the gate with an impurity semiconductor of a second type so as to lightly dope the gate and form a pair of LDD regions on both sides of the gate;

(4) conducting a plasma treatment on the wafer with a plasma of nitrogen, thereby allowing the forming of a thin layer of silicon nitride which covers the LDD regions and the gate;

(5) forming a spacer of silicon dioxide on the sidewall of the gate, the silicon nitride remaining over the LLD regions and the gate; and (6) using the spacer as a mask to conduct a second ion implantation process on the wafer with an impurity semiconductor of the second type so as to form a pair of heavily doped source/drain regions in the wafer.

5. The method of claim 4, wherein the plasma is formed by using a gas selected from the group consisting of $N_2$, nitrogen oxide, a mixture of nitrogen/oxygen, and ammonia.

6. The method of claim 5, wherein the plasma is applied to the wafer with an energy of 150 W and a flow rate of 100 sccm.

7. A method of making a MOS transistor, comprising:

forming a gate on a substrate;

forming source/drain regions in the substrate, and on opposite sides of the gate; and forming a dielectric layer over the gate and locatable over the source/drain regions, wherein said forming a gate includes forming a gate dielectric layer on the substrate, and forming a polysilicon gate layer on the gate dielectric layer, Wherein said forming a dielectric layer includes:

infusing the polysilicon gate layer and a surface of the substrate with a plasma of nitrogen molecules;

forming silicon dioxide spacers on sidewalls of the gate; and reacting the nitrogen molecules with silicon in the silicon dioxide spacers and the polysilicon gate layer to form the dielectric layer.

8. The method recited in claim 7, wherein the dielectric layer comprises silicon nitride.

\* \* \* \* \*